(12) United States Patent
Steger et al.

(10) Patent No.: US 7,939,784 B2
(45) Date of Patent: May 10, 2011

(54) ELECTROSTATIC CHUCK SUPPORT ASSEMBLY

(75) Inventors: Robert Steger, San Jose, CA (US); Keith Comendant, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 12/362,139

(22) Filed: Jan. 29, 2009

(65) Prior Publication Data
US 2009/0161286 A1    Jun. 25, 2009

Related U.S. Application Data

(62) Division of application No. 11/511,367, filed on Aug. 29, 2006, now Pat. No. 7,501,605.

(51) Int. Cl.
*B23K 10/00* (2006.01)
(52) U.S. Cl. ............... 219/494; 219/121.43; 118/724; 118/725; 279/128
(58) Field of Classification Search .............. 219/494, 219/444.1, 497, 121.43, 121.58, 443.1–468.2; 361/230–235; 279/128
See application file for complete search history.

(56) References Cited

U.S. PATENT DOCUMENTS

| | | | |
|---|---|---|---|
| 5,671,116 A | 9/1997 | Husain | |
| 5,675,471 A | 10/1997 | Kotecki | |
| 5,730,803 A | 3/1998 | Steger et al. | |
| 5,880,922 A | 3/1999 | Husain | |
| 6,406,545 B2 | 6/2002 | Shoda et al. | |
| 6,466,426 B1 | 10/2002 | Moke et al. | |
| 6,566,632 B1 | 5/2003 | Katata et al. | |
| 6,669,783 B2 | 12/2003 | Sexton et al. | |
| 6,740,853 B1 * | 5/2004 | Johnson et al. | 219/444.1 |
| 6,847,014 B1 | 1/2005 | Benjamin et al. | |
| 6,890,403 B2 | 5/2005 | Cheung et al. | |
| 6,964,812 B2 * | 11/2005 | Ito et al. | 428/408 |
| 7,311,782 B2 * | 12/2007 | Strang et al. | 118/724 |
| 7,457,098 B2 * | 11/2008 | Nakamura | 361/234 |
| 2002/0196596 A1 | 12/2002 | Parkhe et al. | |
| 2003/0089457 A1 | 5/2003 | Nallan et al. | |
| 2004/0058070 A1 | 3/2004 | Takeuchi | |

(Continued)

OTHER PUBLICATIONS

International Search Report and Written Opinion dated Mar. 12, 2008 for PCT/US07/18711.

(Continued)

*Primary Examiner* — Mark H Paschall
(74) *Attorney, Agent, or Firm* — Buchanan Ingersoll & Rooney PC

(57) ABSTRACT

A method of tuning the thermal conductivity of an electrostatic chuck (ESC) support assembly comprises measuring the temperature at a plurality of sites on a support assembly surface in which each site is associated with a given cell, determining from the measurements any fractional reduction in area suggested for each cell, and removing material from the support assembly surface within each cell in accordance with the suggested fractional reduction in order to decrease thermal conductivity in that cell. The material removal can result in an improvement to the equilibrium temperature uniformity of the electrostatic chuck support assembly at the chuck surface of an electrostatic chuck bonded to the support assembly surface, or can result in an equilibrium temperature profile of the ESC support assembly which approaches or achieves a target equilibrium temperature profile. Thermal conductivity tuning can thus take place by a method comprising defining a cell structure, determining the target areal density of each cell and removing a fractional area of material to achieve the target areal density for that cell. Material removal can be effected by drilling, routing, laser machining or grit blast machining on an X-Y table.

19 Claims, 4 Drawing Sheets

U.S. PATENT DOCUMENTS

| | | |
|---|---|---|
| 2004/0166612 A1 | 8/2004 | Maydan et al. |
| 2004/0168769 A1 | 9/2004 | Matsuoka et al. |
| 2005/0178335 A1 | 8/2005 | Strang et al. |
| 2005/0211385 A1 | 9/2005 | Benjamin et al. |
| 2006/0076109 A1 | 4/2006 | Holland et al. |
| 2006/0144516 A1* | 7/2006 | Ricci et al. ............... 156/345.27 |

OTHER PUBLICATIONS

International Preliminary Report on Patentability mailed Mar. 12, 2009 for PCT/US2007/018711.

Chinese Official Action mailed Jan. 8, 2010 for Chinese Patent Appln. No. 200780032316.7.

* cited by examiner

ELECTROSTATIC CHUCK SUPPORT ASSEMBLY

CROSS-REFERENCE TO RELATED APPLICATIONS

This application is a divisional application of U.S. application Ser. No. 11/511,367 entitled METHOD OF TUNING THERMAL CONDUCTIVITY OF ELECTROSTATIC CHUCK SUPPORT ASSEMBLY, filed on Aug. 29, 2006 now U.S. Pat. No. 7,501,605, the entire content of which is hereby incorporated by reference.

BACKGROUND

As semiconductor technology progresses, decreasing transistor sizes call for an ever higher degree of accuracy, repeatability and cleanliness in wafer processes and process equipment. Various types of equipment exist for semiconductor processing, including applications that involve the use of plasmas, such as plasma etch, plasma-enhanced chemical vapor deposition (PECVD) and resist strip. The types of equipment required for these processes include components which are disposed within the plasma chamber, and must function with consistently high performance. To be cost effective, such components must often withstand hundreds or thousands of wafer cycles while retaining their functionality and cleanliness. One such component, the electrostatic chuck support assembly, is used to retain a semiconductor wafer or other substrate in a stationary position during processing, and provide a consistent, uniform temperature. One component of the assembly, the electrostatic chuck, provides more uniform clamping than chucks employing mechanical clamping, and can operate in vacuum chambers where a vacuum chuck cannot be used. However, variations in aspects of the thermal conductivity of the assembly can cause undesirable process variations within a wafer.

SUMMARY

A method of tuning the thermal conductivity of an electrostatic chuck (ESC) support assembly is provided. The assembly comprises a temperature controlled base plate and optional heater plate, and the method comprises measuring the temperature at a plurality of sites on the surface of the support assembly in which each site is associated with a given cell, determining from the measurements any fractional reduction in area suggested for each cell, and removing material from the support assembly surface within each cell in accordance with the suggested fractional reduction in order to decrease thermal conductivity in that cell. The compendium of all cells associated with a given ESC support assembly is referred to as a "cell structure".

The material removal can result in an improvement to the equilibrium temperature uniformity of the electrostatic chuck support assembly at the chuck surface, or can result in an equilibrium temperature profile of the ESC support assembly which approaches or achieves a target equilibrium temperature profile.

The temperature measurements can be made with a temperature sensor such as a thermocouple or an IR sensor and the material can be removed by forming holes in the base plate or heater plate surface where the holes can have the same or different shapes of the same or different depths. One example of a cell structure is a grid pattern comprising a plurality of grid cells. Material removed from each grid cell is preferably in the form of holes, wherein the number of holes formed in each cell can be none, one, or more than one. Material removal can be effected by drilling, routing, laser machining or grit blast machining such as with numerically controlled machining equipment. The electrostatic chuck support assembly can be bonded to an electrostatic chuck and used to support a semiconductor substrate in the interior of a plasma processing chamber such as a plasma etch chamber.

An apparatus useful for determining a target thermal conductivity profile can include a support to hold the ESC chuck assembly, a numerically controlled positioning member capable of positioning a sensor at a plurality of predetermined points on a support assembly surface, a probe supported by the positioning member, a controller operable to move the positioning member to various positions on the surface, and a unit capable of registering and recording measurement data signals from the probe, and electronically determining the target areal density configuration from the data signals.

DETAILED DESCRIPTION

Figure 1:
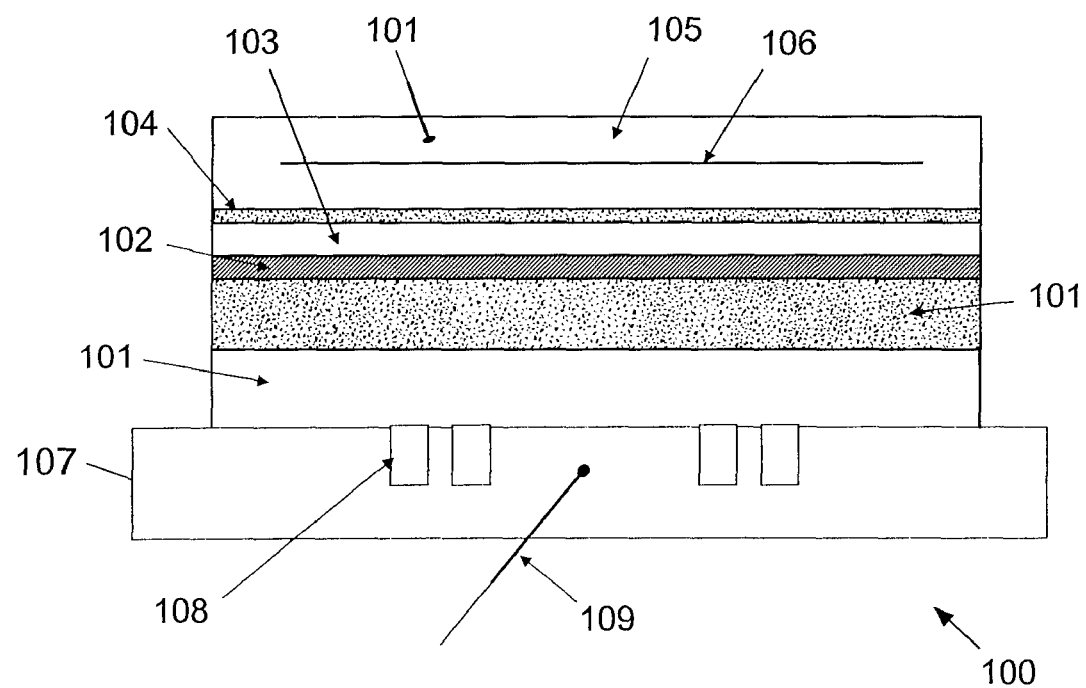
FIG. 1 depicts a schematic cross section of an exemplary electrostatic chuck support assembly.

Plasma processing apparatuses for semiconductor substrates, such as silicon wafers, include plasma etch chambers which are used in semiconductor device manufacturing processes to etch such materials as semiconductors, metals and dielectrics. Components of plasma processing apparatuses include electrostatic chucks, which are used to retain semiconductor substrates such as wafers in a stationary position during processing. Electrostatic chucks provide more uniform clamping and better utilization of the surface of a wafer than mechanical chucks and can operate in vacuum chambers where vacuum chucks are less effective. An electrostatic chuck uses an electrostatic potential to hold a substrate in place during processing. By clamping the substrate to the chuck, improved thermal conductivity between the substrate and the chuck can be provided. Optionally, a high thermal conductivity gas such as helium may be introduced between the substrate and the chuck in order to improve heat transfer therebetween. Examples of electrostatic chucks are provided in commonly-owned U.S. Pat. Nos. 6,847,014, 5,880,922 and 5,671,116. See also commonly owned U.S. Patent Publication No. 2005/0211385A1

In general, electrostatic chucks comprise an electrically insulating ceramic support with one or more electrodes embedded inside the ceramic. For example, the electrode can be a tungsten frit, a mixture of metal powder and ceramic or glass, such as a metal glass or metal ceramic. The electrode need not be a contiguous metal, and may be applied by a number of techniques, including screen printing. ESCs in thicknesses from 0.8 mm to 15 mm are available from Shinko Electric America, San Jose, Calif. A chucking voltage is applied to the electrode by way of an electrical contact. The application of the chucking voltage creates an attractive coulombic force, causing a wafer to be maintained in position against the insulating ceramic layer. The shape of the chuck may include a conventional disk commonly used in plasma etching systems and the chuck may be supported in the chamber by various arrangements, such as by using a cantilevered support arm. The insulating layer may have grooves, mesas, openings, recessed regions, and like features and may be from about 0.2 mm to about 2 mm thick.

As demands on process outputs such as wafer uniformity increase, substrate support surfaces are required to deliver higher performance. For example, process control problems in critical etch applications call for improved control of temperature across the wafer. Error in the accuracy of lateral dimensions in some etch processes can be sensitive to temperature and be up to +/−1 nm/° C. A desirable control of lateral features of 1-2 nm therefore requires temperature uniformity and repeatability of less than 1° C., and preferably less than 0.4° C. Improving the thermal uniformity of a substrate support surface preferably includes engineering a more precisely controlled ESC support assembly. An ESC support assembly comprises multiple component parts, each of which can introduce error. For example, a support assembly can comprise the ESC, a bond to a heater plate incorporating a thin film heater, a bond to a base plate, and/or the ESC bonded directly to a base plate itself. Deviations from thermal uniformity for each component of the structure may contribute additively to the overall deviation. A compensation for natural variation in the manufacturing process applied to electrostatic chucks which may comprise multiple components would be advantageous.

FIG. 1 shows an example of an ESC support assembly. The support assembly 100 comprises an electrostatic chuck 105 adhered to a heater plate 103 with silicone adhesive layer 104. The electrostatic chuck incorporates at least one electrode 106. The heater plate 103 is preferably of a thermally-conductive material such as a metal or suitable ceramics, in intimate contact with a thin film heater 102 such as a patterned resistive heater. For example, the thin film heater can include an etched foil resistive element laminated between layers of flexible insulation. The resistive element can be a metal and the insulation can be a polyimide such as KAPTON™. The combined thickness of such a thin film heater is from about 3 to about 15 mils. Exemplary thin film heaters are available from Minco (Minneapolis, Minn.). The heater 102 is then mounted on a cold plate 107. Between the heater and cold plate, 0.5-40 mils of silicone 101 can be used to provide thermal resistance. Heater 102 and electrode 106 are powered with electrical connectors which traverse the containment walls of a plasma processing reactor to external power sources (not shown).

The cold plate 107 is a large thermally conductive plate designed for maintaining a pre-determined temperature profile. The cold plate can be made from a material such as aluminum, and is electrically connected to an RF circuit of a plasma processing apparatus (not shown) for plasma processing a substrate, such as a 200 mm or 300 mm silicon wafer. A temperature sensor 109 can be incorporated into the cold plate 107 for temperature measurements. Concentric fluid channels 108 can be provided in the cold plate for supply of temperature control fluids or gasses. In particular, cold plate 107 is preferably adapted to cooperate with a temperature control unit, or TCU (not shown) which is capable of maintaining the temperature of the plate 107 to a desired temperature by use of liquid flowing through a recirculation loop.

Heat from the heater flows through heater plate 103 into the chuck 105 and through silicone 101 into the cold plate 107. In equilibrium, the chuck can reach a temperature of about 30° C. to about 40° C. higher than the cold plate. This temperature difference is maintained by the thermal resistivity of the silicone. Once equilibrium is achieved, all layers above the heater plate are at nominally the same temperature. During plasma processing, energy from the plasma may contribute to chuck heating. Monitoring temperature via chuck thermocouple or other sensor input can provide feedback to the control system which regulates heater power. For instance, if heating of the chuck occurs from the plasma processing of a wafer, the heater power can be reduced or turned off in order to keep the chuck at constant temperature.

Exemplary dimensions for the ESC support assembly include the chuck 105 at 1 mm (40 mils) thick, the adhesive layer 104 at less than 1 mil, the heater plate 103 at 16 mils thick, the thin film heater 102 at 12 mils thick, the thermal resistance layer 101 at 30 mils thick, and the cold plate 107 at 1.5 inches thick. If desired, the cold plate 107 can be wider than the heater plate 103 and chuck 105 and/or the heater plate and chuck can be sized to allow the wafer to overhang outer edges of the chuck.

In a preferred embodiment, the thermal conductivity of an ESC support assembly in the vertical direction is engineered to achieve a target temperature profile. Engineering the thermal conductivity of the ESC support assembly is carried out by modifying one or more layers of the chuck support assembly, e.g., the cold (base) plate and/or the heater plate. For example, by removing thermally conductive material from the heater plate surface or the cold plate surface, the vertical conductivity of the structure is decreased. By selective removal of material, heat from the electrostatic chuck will have a more thermally resistive path in those regions where the thermal conductivity is low, resulting in more uniform temperature at the chuck surface if removal of the material is done at appropriate locations.

The surface of the heater plate or cold plate can be modified to achieve a target areal density. The use of an areal density metric arises when material is removed from a portion of a surface, such that the surface has two regions of consideration: "high" areas from which no material has been removed; and, "low" areas which constitute the bottom surface of the removed areas. The areal density is then the high area divided by the total area of a given region. If a plurality of holes are formed to a given depth into a flat surface, two primary dimensions would affect areal density: hole density; and, hole size or diameter. An increase in either hole size or hole density within a defined region will result in a decrease in areal density.

In manufacturing an ESC support assembly with an engineered thermal conductivity, the fabrication process preferably comprises the removal of material at the surface of the heater plate or cold plate to a depth of about 5 mils to about 10 mils, such that a gap will form between the lower surface of the chuck and the bottom of the hole. The bottoms of the holes are the low areas, while the original upper surface of the heater plate is the high area. The compendium of all cells associated with a given ESC support assembly corresponds to a "cell structure". By imposing a cell structure on the surface of the heater plate or cold plate such that each element of the cell structure has a known area, the density within each element of the cell structure can be determined by the fractional high area within that element. A determination of areal density for all elements in the cell structure determines a quantitative evaluation in plan view of the upper surface of the heater plate or cold plate.

An exemplary plan view of the upper surface of a heater plate in which holes have been fabricated can be seen in FIG.

Figure 2:
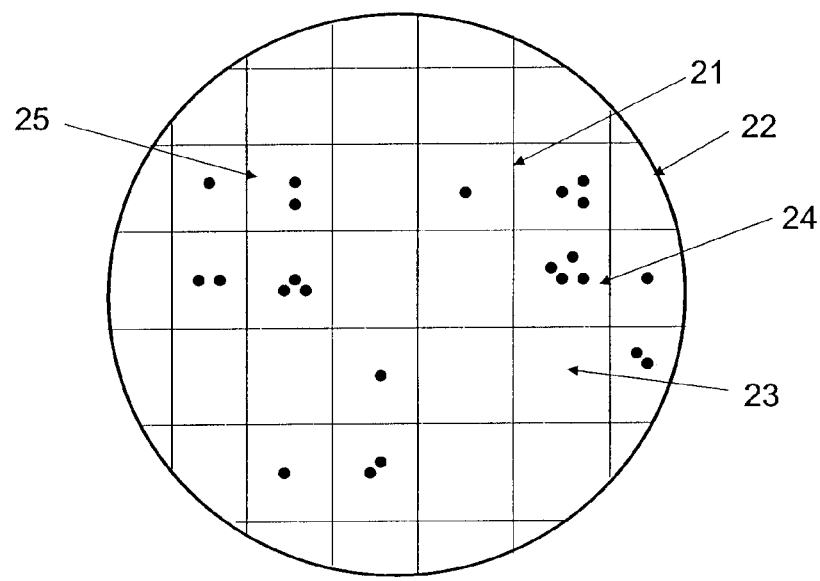
FIG. 2 shows an exemplary grid on a plan view of the upper surface of a heater plate in which holes have been fabricated.

2. In a preferred embodiment, the holes are of constant size (diameter) and depth, and vary in density. In FIG. 2, several groupings of holes can be seen. A grid 21 has been superimposed on top of heater plate 22. For cells with holes, it can be seen that the same number or a different number of holes of constant size may fall within rectangular areas defined by the grid boundary. Each rectangular area 23 can be referred to as a cell. Each cell can be identified by a cell identifier i and has an area $A_i$, where the subscript i refers to the cell identifier. If the sum of the area taken up by n holes, each of area $a_h$, comprises an area $na_h$, then the fractional low area of a given cell i is given by $f_i=na_h/A_i$. For example, the value of $f_i$ for cell n 24 is greater than the value of $f_i$ for cell m 25. The effect of increasing $f_i$ will therefore be to lower the thermal conductivity of the ESC support assembly in the vertical direction in the vicinity of a given cell i.

The thermal conductivity of the metallic heater plate is significantly greater than the thermal conductivity of an insulator. Examples of thermal insulators include suitable ceramics, silicone and air. For example, the reported thermal conductivity of aluminum is 237 W/(mK), while that of quartz is about 10 W/(mK), that of silicone is 1.0 W/(mK) and that of air is 0.026 W/(mK). It will be apparent to those skilled in the art, therefore that filling the holes of a given cell with an insulator will not substantively change the thermal conductivity of the cell compared to allowing the holes to remain empty. The holes are therefore optionally filled, which may be desirable in order to avoid a virtual vacuum leak once bonding is complete. If desired, filling in the holes can be formed from one or more layers of a thermally insulating material. Examples of such insulating materials include, but are not limited to, silicon nitride, silicon dioxide, alumina, silicone, fiberglass loose-fill, polyurethane spray foam, and silica aerogel.

It will be clear to those skilled in the art that grid i can be made finer or coarser. The grid resolution is preferably the lowest resolution which enables achievement of the specified target temperature profile. In other words, if all desired target temperature profiles can be achieved with a grid size of 1 inch on edge, then a grid size finer (smaller) than 1 inch on edge is not necessary. The finer the grid size, the more measurements will be required and the more inefficient the manufacturing process becomes. Conversely, if all desired target temperature profiles cannot be achieved with a grid size of 1 inch on edge, but can be achieved with a grid size of ½ inch on edge, then the preferred grid size would be less than 1 inch on edge, but at least ½ inch on edge.

Figure 3:
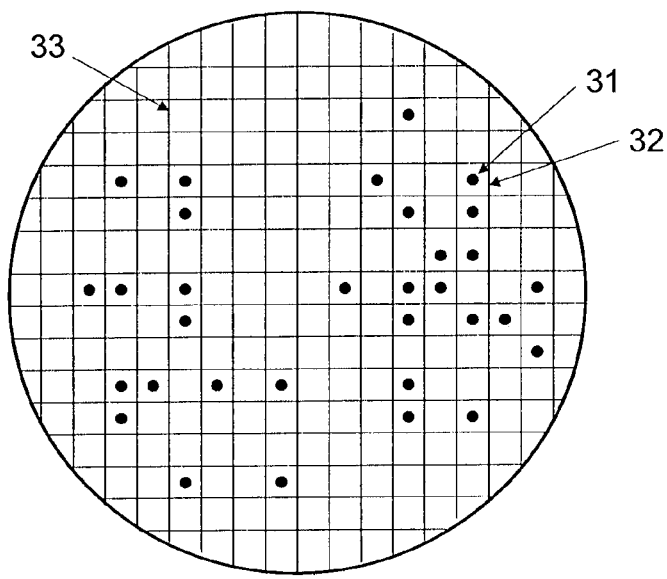
FIG. 3 shows an exemplary grid of such a resolution that at most one hole is to be formed in each grid cell.

In other preferred embodiments, determination of where to form holes and how many holes to form at each location can be achieved through the use of a method comprising determining a grid of such a resolution that at most one hole is to be formed in each grid cell. Using this method, each grid cell will comprise either one hole or no holes. FIG. 3 shows an exemplary embodiment of such a grid. In this case, a single hole 31 occupies cell 32. Other cells, such as cell 33, do not have a hole.

In additional embodiments, the holes can be of virtually any size, shape and arrangement. For example, holes can be elliptical, polygonal or torroidal, have vertical or sloped walls, the bottom surfaces can be concave, flat or convex, and the corners can be sharp or rounded. The holes can take on a "dimple" shape wherein a partial spherical shape is formed in a flat surface. A preferred hole shape, size and arrangement, is substantively circular with vertical walls, a diameter of about 5.0 mils to about 50 mils, and a spacing of about 1 mil to about 100 mils.

In one embodiment, the method comprises partially building up an ESC support assembly to include the cold plate, silicone bond layer, thin film heater and heater plate, but excluding the silicone adhesive between the heater plate and the chuck, and the electrostatic chuck itself. The heater is activated to a preset temperature, and sufficient time is allowed for thermal equilibrium of the structure to be achieved. The top surface of the structure is the smooth top surface of the heater plate. Initial temperature measurements of the heater plate surface are made according to a pre-determined grid covering the plate. In another embodiment, the cold plate is brought to a preset temperature by circulating temperature controlled liquid therethrough.

A temperature probe can be used to measure local temperature, such as the HPS-RT-(*)-18G-12 fast response k-type probe available from Omega Engineering (Stamford, Conn.). In alternative embodiments, a non-contacting infrared (IR) sensor could be used. Other temperature probes, such as Resistance Temperature Devices (RTD), Bimetallic Temperature Measurement Devices, Fluid-Expansion Temperature Measurement Devices, and Change-of-State Temperature Measurement Devices can also be used. Alternatively, an IR camera capable of spatial resolution of the grid size, such as the ExplorIR™ thermal infrared imaging radiometric camera, available from Sierra Pacific Corp (Las Vegas, Nev.) can be used. However, any suitable temperature measuring device capable of measuring temperature in the range of interest at the resolution of the grid size can be used.

Preferably, a single measurement is then made at each cell. A collection of the resulting data as a function of x-y position provides a temperature map. A hole or holes are then formed in each grid cell for which the measured temperature differs from the target temperature and outside of the specified tolerance range. Hole formation in the heater plate or cold plate modifies the thermal conductivity profile by decreasing local conductivity. In a preferred embodiment, the modification results in an improvement to the equilibrium temperature uniformity of the ESC support assembly at the chuck surface after bonding the ESC to the heater plate or directly to the cold plate, such that the equilibrium temperature profile seen at the chuck surface is within the specification provided. In other embodiments, the modification results in an alteration to the equilibrium temperature profile such that the profile is within a provided specification of a target equilibrium temperature profile.

In a preferred embodiment, material is removed by way of the formation of at least one hole. If more material removal is required, a plurality of holes can be formed, where each hole is nominally the same size, i.e. cross sectional area. In alternative embodiments, material removal within a cell is effected by the formation of a single hole. In this case, if more material removal is required, the hole is formed with a larger diameter. In further embodiments, material removal can be effected by the formation of any shape extending into the heater plate surface or cold plate surface.

In accordance with the above discussion, removal of material will result in a reduction of heat flux between the ESC and the cold plate and thus an increase in chuck temperature when heated due to plasma processing a substrate. Therefore using material removal alone, a desired uniformity in chuck temperature can be achieved by selecting a target temperature on the heater surface or cold plate surface that is at least as high as the highest of the measured $T_m$'s. A target temperature for all sites i of the grid is thus chosen and denoted $T_o$, and will, in general differ from the measured $T_m$'s by an amount denoted by $\in_i$, wherein:

$$\in_i = T_o - T_m \quad (1)$$

The objective of the localized material removal is then to bring $\in_i$ to within specification for all sites i. Defining q as the heat flux per unit area, the general heat transfer equation is given as $$q = Q/A_i = \Delta T \times K_{\mathit{eff}} \quad (2)$$

where $K_{\mathit{eff}}$ is the effective heat transfer coefficient of the substrate support structure in the vertical direction of cell i, and $\Delta T$ is the positive temperature difference between the two points defining each end of the vertically projected area between which $K_{\mathit{eff}}$ is the effective heat transfer coefficient.

In a preferred embodiment, $\Delta T$ is set to be equal to $\in_i$, the measured temperature difference between each cell measurement and the highest of the cell measurements at the heater surface. Although $\Delta T$ in Eq. 2 is associated with a temperature difference in the vertical direction, and $\in_i$ is associated with a temperature difference in the lateral direction, $\Delta T$ is set equal to $\in_i$ because $\in_i$ is the desired target temperature difference of cell i to needed to achieve the target temperature. Adjustment of $K_{\mathit{eff}}$ is a preferred method for cell i to achieve temperature $T_o$.

Because cell i will be composed of metal or ceramic material and holes, the effective heat transfer coefficient $K_{\mathit{eff}}$ is composed of two components: the conduction-only heat transfer in unremoved regions, and the conduction plus convection heat transfer in removed regions. For example, in the case of an aluminum heater plate, since the thermal conductivity of air is significantly lower than the thermal conductivity of aluminum, the heat conductivity in removed regions is neglected. Thus $K_{\mathit{eff}}$ can be approximated as $K_h$, the thermal conductivity of the heater plate, multiplied by the fraction of unremoved area of the cell.

With n holes in cell i of the heater plate, each of area $a_h$, the areal density of cell i having a high surface area in nominal contact with the chuck after the preferred adjustments have been made (the "fractional high area") is given by:

$$\alpha_f = [A_i - na_h]/A_i = 1 - f_i \quad (3)$$

The term "nominal" is used to mean that any incidental surface roughness is ignored, and the surface is approximated as planar. In other words, ignoring roughness and non-parallelism, $\alpha_f$ is the fractional surface area within the cell area $A_i$. Then for each probe temperature measurement $T_m$, $\alpha_f$ is sought for each cell to determine the target surface area and thus the total removed area for that cell in order to achieve the desired $K_{\mathit{eff}}$.

Without holes, the thermal conductivity is designated $K_m$, and with holes, the thermal conductivity $K_{\mathit{eff}}$ can be approximated as $\alpha_f K_h$. If the change to the conductivity is small compared to the absolute conductivity (i.e. if the total hole area of a given cell is small compared to the cell area), q can be considered constant. Furthermore, the cold plate is maintained at constant temperature $T_c$. In this event, Eqs. 1 and 2 can be rewritten to give $$K_h(T_0 - T_c) = K_m(T_m - T_c) \quad (4)$$

In order to get $T_m$ to reach $T_o$, $K_m$ must be decreased to the value of $K_h$. Therefore $\alpha_f$ is set to $K_h/K_m$, and from Eq. 4, $f_i = na_h/A_i$, is known. Since the areas of the formed holes and the cell are known, the suggested number of holes n is determined. An equation providing n for a given probe measurement of cell i can then be written as:

$$n = (A_i/A_n) \times (T_0 - T_m)/(T_0 - T_c). \quad (5)$$

Thus the set of $T_m$ determined for the plurality of measurement sites can be used to determine the preferred fractional hole area for each cell, or the preferred number of holes of a given size.

In an alternative embodiment, $f_i$ can be determined without using the approximation that $f_i$ is much smaller than unity. A test heater plate is provided or formed, in which each cell of the grid has a different number n of holes, wherein the number increases for each cell starting from zero. For example, the test plate could have zero holes in cell 1, one hole in cell 2, two holes in cell 3, etc. However, any number of different scenarios could produce acceptable results. For example, the test plate could have 10 holes in cell 1, 5 holes in cell 2, 13 holes in cell 3, and so forth. In the case of the test heater plate, the temperature cannot be measured on the heater plate surface because the holes are formed before temperature data is collected. Instead the rest of the substrate support structure is built up, i.e. the silicone adhesive layer and the electrostatic chuck are built onto the test heater plate, such that the top surface of the structure is the top surface of the chuck.

Figure 4:
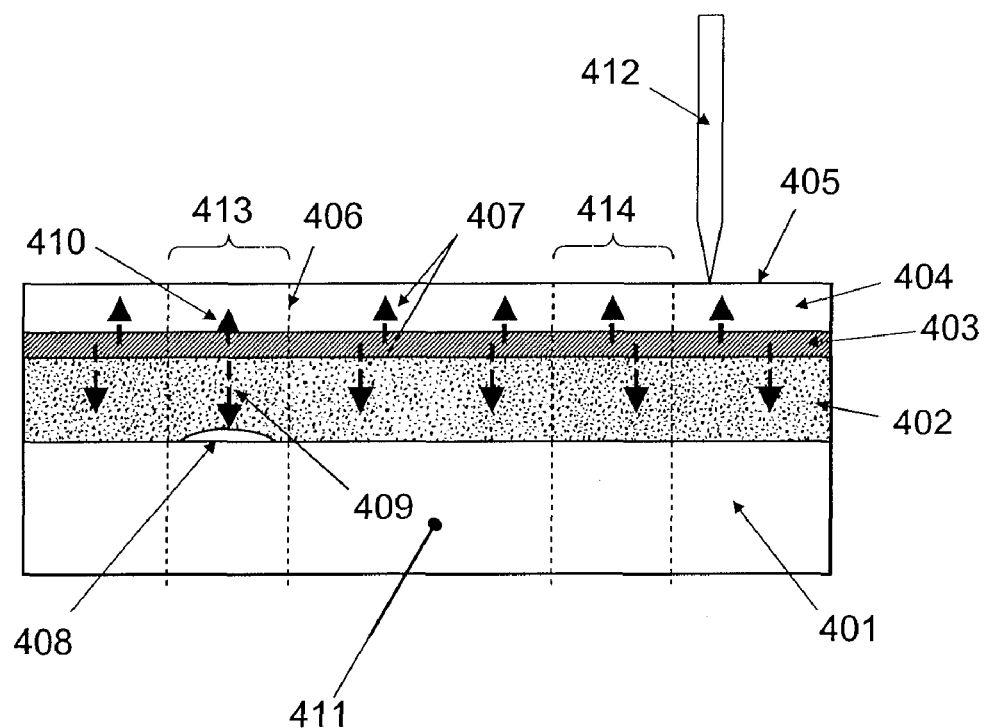
FIG. 4 shows an exemplary probe positioned on a partially built-up ESC support assembly with an imperfection.

The heater is activated to a preset temperature, and sufficient time is allowed for thermal equilibrium of the test ESC support assembly structure to be achieved. Initial temperature measurements of the chuck surface are made at locations determined from a grid arranged to cover the chuck in such a way that the grid is identical in size and lateral position to the grid defined for the heater plate. From the measurements, a set of $T'_m$ is determined, where the prime (') is used to indicate that the temperature is measured on the chuck surface instead of the heater plate surface. Values of $T'_m$ vs. n are then plotted, and a determination of the slope β of a straight line fit of the data provides a measure of the change in $T'_m$ with each additional hole.

β thus provides an actual estimation of temperature difference at the chuck surface due to each additional hole. Although the variations in chuck surface temperature due to random variations in the vertical thermal conductivity of the ESC support assembly are present and thus incorporated in the data, they are preferably substantively averaged out by the technique of performing a straight line fit of the data. With β established, any observed cell temperature difference can be corrected for by a direct application of the knowledge of the effect of a hole on temperature. The number of preferred holes per cell in future ESC support assemblies built up to the heater plate, as in the embodiment described above, can then be determined by using the relationship $$n = \in_i/\beta \quad (6)$$

for each cell i. With experience, further refinements to this method are possible. For example, upon first application of this technique if it is determined that the use of Eq. 6 leads to an over- or under-correction, a correction factor C can be introduced, so that a preferred value for n is $n = C\in_i/\beta$ An example of the use of the preferred method is considered in the following analysis: A depiction of probe 412 positioned on an exemplary partially built-up ESC support assembly is shown in FIG. 4. In equilibrium, heat flux Q 407 flows from the heater 403 in both the upward and downward directions. In the upward direction, heat flows through the heater plate 404 to the surface 405, and in the downward direction heat flows through the silicone adhesive 402 and into the cold plate 401. For the purpose of this analysis, we consider a plan view section 413 with area $A_1$, equivalent to one cell size, such as is exemplarily shown in FIG. 2, ref. 21. An approximate thermal analysis is carried out by considering a vertical projection of plan view area $A_1$ 406 extending through the substrate support structure, and neglecting lateral heat flow to or from the rest of the support assembly.

If heater 403 is set to constant temperature $T_o$, then heat flow will be a function of temperature and thermal conductivity above and below the heater. After a period of time, as the temperature of the heater plate 404 rises to equal the temperature of the heater, equilibrium of the support configuration will be reached. Cold plate 401 is maintained at a constant temperature $T_c$, so that in equilibrium, heat will flow continuously through the silicone 402 into cold plate 401. Correspondingly, the upper surface 405 of heater plate 404 is a free surface, and is capable of emitting heat through convection if atmosphere is present, and through emission or radiation. In thermal equilibrium, heat flow into and out of heater plate 404 are equal, and the temperature remains constant.

If silicone layer 402 has any thickness non-uniformities, the thermal conductivity in the vicinity of the non-uniformity will be different from the conductivity of the surrounding area. If, for example, the silicone is thinner, more heat will transfer from the heater to the cold plate in that area. Since the heater gives off a fixed amount of heat in a given area, if more heat is drained from one side of the heater in one area, the other side of the heater will be cooler in that area. Thus in the area of thin silicone, less heat will be supplied to the chuck, above, and the substrate will see a cold spot. For example, if a perfectly conductive heat sink were placed at one spot on one side of the heater, all the heat produced by the heater in the area of the spot could potentially be drained away, resulting in no heat flux in the other direction.

A non-uniformity in the thickness of the silicone is considered comparing the temperature profiles of cell areas $A_1$ and $A_2$, shown as 413 and 414, respectively, in FIG. 4. The columnar volume associated with cell area $A_1$ contains an imperfection 408 in the form of a decrease in the silicone thickness. The vertical thermal conductivity within the columnar volume associated with cell area $A_1$ ("$K_1$"), is therefore higher than the conductivity of the similar volume associated with cell area $A_2$ ("$K_2$"), and upon heating from exposure to plasma, the temperature at the surface of 413 would be expected to be cooler than the temperature at the surface of 414.

Figure 5:
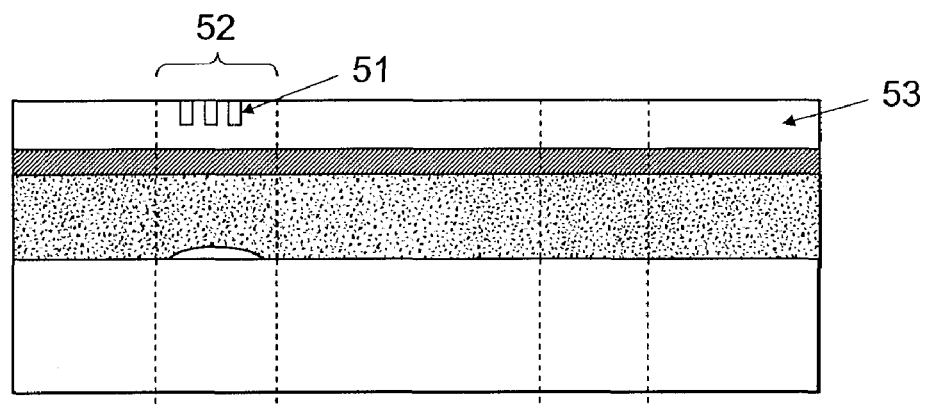
FIG. 5 shows exemplary holes formed in a cell of the heater plate on a partially built-up ESC support assembly.

A mechanical correction can now be made to the heater plate to achieve a more uniform thermal conductivity across the support assembly. Using $T_m$ and thus $T_o$ obtained from probe 412 and $T_c$ obtained from thermocouple 411, or optionally $\beta$ obtained from prior experimentation, the target fractional high area $\alpha_f$ within each cell is determined in accordance with Eq. 5 or Eq. 6. $K_1$ is then adjusted to the target thermal conductivity value of $\alpha_f K_1$ by introducing holes into the cell 413. This can conveniently be accomplished using any of known techniques for coordinate controlled material removal, where removal is effected, for example, by drilling, routing, laser machining or grit blast machining, and coordinate control is effected by the use of an X-Y table. The area reduction process is repeated for each measurement site. Exemplary holes 51 in cell 52 of heater plate 53 are shown in FIG. 5.

The testing is preferably carried out in an apparatus that allows for support of the chuck support assembly as well as enablement of the desired test conditions (not shown). An appropriate apparatus comprises a test chamber configured to maintain the cold plate at a set temperature. The apparatus is preferably capable of supporting and numerically controlling x-y positioning of a temperature probe. The apparatus is also preferably capable of registering and recording measurement data signals from the probe, as well as electronically determining the target hole configuration from the data.

The target hole configuration is preferably designed to achieve the desired temperature profile at any point on the chuck support surface. Since temperature is measured only at locations where a temperature measurement is made, increasing the resolution of the desired temperature profile requires increasing the number of measurement sites on the heater plate or the cold plate, i.e. increasing the fineness of the grid. The resolution of the grid is thus determined experimentally and through experience. For example, if a temperature uniformity specification has been met with a given grid, and additional measurements taken at points not on the original grid show a deviation from the established specification, then a finer grid resolution is preferred.

Based on all prior discussion, a preferred embodiment of a process involving reducing the localized thermal conductivity of an ESC support assembly to achieve a target temperature profile across a chuck surface mounted thereon comprises the following experimental procedure:

1. Build up an ESC support assembly with or without a heater plate, i.e. do not bond a chuck to the top surface of the assembly.
2. Power the heater plate or heat the cold plate and wait for equilibrium temperature to be established.
3. Position a probe at each measurement site on the heater plate or cold plate surface, based on the pre-established grid density.
4. Measure and record the resultant heater plate or cold plate temperature and x-y coordinates at each site, thus determining $T_m$ for all sites on the grid.
5. Determine $T_o$ by selecting a temperature at least as large as the highest of the $T_m$'s.
6. Determine $\in$ for each site from Eq. 1
7. Use Eq. 5 to determine $f_i$ or Eq. 6 to determine n for all sites on the grid.
8. Form n holes in each grid cell consistent with each determined $f_i$.

Figure 6:
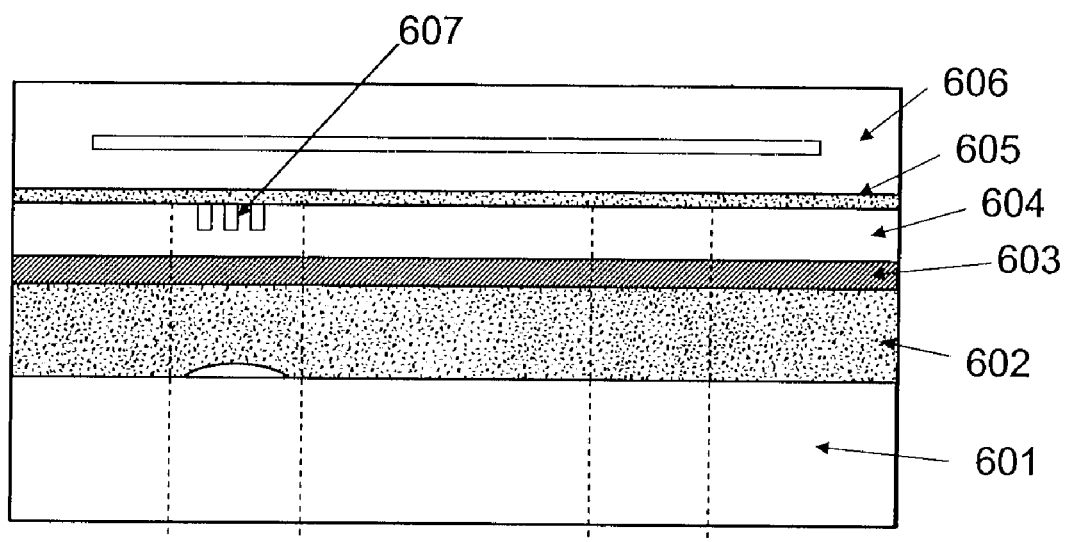
FIG. 6 shows an exemplary full ESC support assembly with a corrected heater plate surface wherein the holes extend to a depth less than the heater plate thickness.

After the heater plate surface or cold plate surface has been adjusted to achieve the desired temperature map, the rest of the ESC support assembly can be built up. For example, above the corrected heater plate surface a layer of silicone adhesive is applied, followed by the placement of the electrostatic chuck. An exemplary full ESC support assembly is shown in FIG. 6 showing cold plate 601, silicone adhesive 602, heater 603, heater plate 604, silicone adhesive 605 and electrostatic chuck 606. Holes 607 can be seen in cross section initiating at the surface of heater plate 604 and extending to a depth partially traversing the heater plate.

While various embodiments have been described, it is to be understood that variations and modifications may be resorted to as will be apparent to those skilled in the art. Such variations and modifications are to be considered within the purview and scope of the claims appended hereto. All of the above-mentioned references are herein incorporated by reference in their entirety to the same extent as if each individual reference was specifically and individually indicated to be incorporated herein by reference in its entirety.

What is claimed is:

1. An electrostatic chuck (ESC) support assembly, the assembly comprising an electrostatic chuck bonded to an upper surface of a heater plate, and an upper surface of a base plate bonded to a lower surface of the heater plate, wherein material has been removed from a support assembly surface within at least one cell of a grid pattern across the support assembly surface so as to decrease thermal conductivity in each cell having material removed to achieve a target thermal conductivity configuration across the support assembly surface, wherein the material is removed only from the upper surface of the heater plate or the upper surface of the base plate.

2. The ESC assembly of claim 1, wherein the material has been removed by forming holes in the upper surface of the heater plate.

3. The ESC assembly of claim 2, wherein the holes have elliptical, polygonal or torroidal cross-sectional shapes.

4. The ESC assembly of claim 2, wherein the holes have vertical or sloped walls, and the bottom surfaces are substantively concave, flat or convex.

5. The ESC assembly of claim 2, wherein the holes have a maximum dimension in cross-section of about 5.0 mils to about 50 mils.

6. The ESC assembly of claim 2, wherein the holes within a given cell are spaced apart by about 1 mil and about 20 mils.

7. The ESC assembly of claim 2, wherein the holes within a given cell have a nominally constant maximum dimension in cross-section.

8. The ESC assembly of claim 1, wherein the grid pattern comprises a grid size between 0.1 inches and 1 inch.

9. The ESC assembly of claim 2, wherein no more than one hole is formed in each cell.

10. The ESC assembly of claim 1, wherein the material has been removed by drilling, routing, laser machining or grit blast machining.

11. The ESC assembly of claim 1, wherein the base plate comprises a cold plate.

12. The ESC assembly of claim 1, wherein the heater plate includes a film heater bonded to a metal plate.

13. The ESC assembly of claim 1, wherein the electrostatic chuck comprises a layer of ceramic material with at least one embedded electrode and the heater plate includes a patterned resistive heater in contact with a metal or ceramic plate.

14. The ESC assembly of claim 1, wherein the base plate is bonded to the heater plate by a 0.5 to 40 mils thick nonuniform layer of adhesive.

15. The ESC assembly of claim 1, wherein the base plate is an RF driven electrode having fluid channels which circulate temperature controlled liquid therethrough.

16. The ESC assembly of claim 1, wherein the electrostatic chuck is bonded to the heater plate by a 1 mm thick layer of adhesive.

17. The ESC assembly of claim 1, wherein the heater plate is about 16 mils thick, the electrostatic chuck is about 40 mils thick, an adhesive bond layer between the electrostatic chuck and heater plate is about 1 mil thick and an adhesive layer between the heater plate and the base plate is about 30 mils thick.

18. The ESC assembly of claim 2, wherein the holes have depths of 5 to 10 mils.

19. The ESC assembly of claim 2, wherein the holes have a constant diameter and depth, the holes varying in density across the support assembly surface.

* * * * *